United States Patent [19]

Nishimatsu et al.

[11] Patent Number: 4,462,863
[45] Date of Patent: Jul. 31, 1984

[54] MICROWAVE PLASMA ETCHING

[75] Inventors: Shigeru Nishimatsu, Kokubunji; Keizo Suzuki, Hachioji; Ken Ninomiya, Tokyo; Ichiro Kanomata, Fuchu; Sadayuki Okudaira; Hiroji Saida, both of Kokubunji, all of Japan

[73] Assignee: Hitachi, Ltd., Tokyo, Japan

[21] Appl. No.: 459,240

[22] Filed: Jan. 19, 1983

Related U.S. Application Data

[62] Division of Ser. No. 298,583, Sep. 2, 1981, abandoned.

[30] Foreign Application Priority Data

Sep. 10, 1980 [JP] Japan ................... 55-124521

[51] Int. Cl.³ ............... H01L 21/306; B44C 1/22; C03C 15/00; C03C 25/06
[52] U.S. Cl. .................... 156/643; 156/345; 156/646; 204/192 E; 204/298; 252/79.1
[58] Field of Search ............... 156/643, 646, 656, 657, 156/659.1, 345, 645; 252/79.1; 427/38, 39; 204/164, 192 EC, 192 E, 298

[56] References Cited

U.S. PATENT DOCUMENTS

| | | | |
|---|---|---|---|
| 4,265,730 | 5/1981 | Hirose et al. | 156/345 X |
| 4,283,249 | 8/1981 | Ephrath | 156/345 X |
| 4,324,611 | 4/1982 | Vogel et al. | 156/345 X |
| 4,330,384 | 5/1982 | Okudaira et al. | 156/643 X |

*Primary Examiner*—William A. Powell
*Attorney, Agent, or Firm*—Antonelli, Terry & Wands

[57] ABSTRACT

A microwave plasma etching system is disclosed which comprises a vacuum chamber for providing a discharge space and provided with an inlet for introducing a discharge gas containing a fluorine-containing gas, hydrogen and oxygen, magnetic field forming means for forming a magnetic field in the discharge space, microwave electric field forming means for forming a microwave electric field in the discharge space, and substrates holding means for holding substrates to be processed in the vacuum chamber. In the microwave plasma etching, the discharge gas containing fluorine, hydrogen with or without oxygen provides excellent etching almost free from side etching.

12 Claims, 6 Drawing Figures

MICROWAVE PLASMA ETCHING

This is a division of application Ser. No. 298,583, filed Sept. 2, 1981, now abandoned.

The present invention relates generally to etching for use in the production process of semiconductor integrated circuits and more particularly, concerns an improved microwave plasma etching which allows quick and dry etching and is almost free from the side etching (undercutting).

Semiconductor integrated circuit technology has been developing steadily to be finer and more highly integrated with the years. Such fine lithographic techniques are expected to be indispensable that allow processing of workpieces (semiconductor integrated circuits) down to the sizes from 1 micron to submicrons. In such fine pattern lithography, dry plasma etching technique is being employed more and more widely in place of conventional wet chemical etching technique.

Figure 1A:
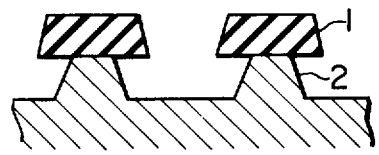
Figure 1B:
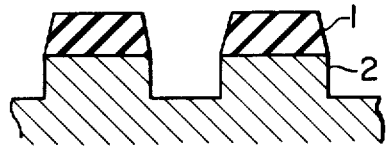

Fine pattern lithography will be very difficult if there exists non-negligible side etching (undercutting) which causes an etched material (a processed material) 2 to be slender than an etching mask 1, as shown in FIG. 1A. In order to enable such fine patterning, it is desirable that the etched material (processed material) 2 have substantially the same shape as the etching mask 1, in other words, that substantially no side etching (undercutting) takes place, as shown in FIG. 1B.

In the usual wet etching technique referred to above, however, it is fundamentally impossible to avoid such side etching. On the other hand, the above-mentioned conventional dry plasma etching technique can allow much finer processing than the conventional wet etching technique but even in the conventional dry plasma etching technique, it is impossible to avoid occurrence of side etching (undercutting). For example, when single crystal silicon substrates or polycrystalline silicone substrates are to be etched by the conventional plasma etching, a barrel type plasma etching apparatus or a parallel plates type reactive sputter etching apparatus may be used in combination with a carbon fluoride discharge gas such as $CF_4$, $C_3F_8$ or $C_2F_6$. In this case, the pressure of the discharge gas is normally held at a pressure of from 10 Torr (approximately $10^3$ Pa) to $10^{-2}$ Torr (approximately 1 Pa) such that there will exist a number of fluorine radicals which have a long life time. This will result in the fact that the resulting etched configurations are as shown in FIG. 1A, i.e. side etching inavoidably occurs. Therefore, it is difficult to get such etching configurations as shown in FIG. 1B wherein side etching does not appear appreciably.

Further, in the event that thin silicon films are etched or processed by such prior art plasma etching technique, side etching will take place as illustrated in FIG. 1A such that the processing dimensions become smaller usually by the amount approximately equal to the film thickness or two times the film thickness than the dimensions of the mask, which makes the fine process difficult.

Therefore, it is an object of the present invention to provide microwave plasma etching which eliminates the above problems, i.e. which causes substantially no side etching.

According to a preferred embodiment of the present invention, the above object has been achieved by providing a microwave plasma etching system which comprises a vacuum chamber defining a discharge space and provided with inlet means for introducing discharge gas including mixture of fluorine-containing gas and hydrogen gas, magnetic field forming means for forming a magnetic field in the discharge space, microwave electric field forming means for forming a microwave electric field in the discharge space, and substrates holding means for holding substrates to be treated in the vacuum chamber.

Another aspect of the present invention is characterized in that a proper amount of oxygen ($O_2$) gas is mixed in the above-mentioned mixture gas in order to prevent the reduction of the etching rate resulting from the mixed hydrogen gas.

The above-mentioned microwave plasma etching enables etching which causes substantially no side etching, which then allows highly fine processing so that highly integrated semiconductor elements can be fabricated.

More specifically, the principle of the present invention is based on the fact that neutral fluorine radicals being free from the influence of electric field move at random, leading to occurrence of side etching. The microwave plasma etching in accordance with an embodiment of the present invention employs a low pressure around $10^{-4}$ Torr (approximately $10^{-2}$ Pa) for the pressure of etching gas. The use of such a low gas pressure will reduce the density of fluorine radicals and hence the side etching even when a carbon fluoride ($C_nF_{2n+2}$) discharge gas alone is used. The use of $SF_6$, $S_iF_4$ or $NF_3$ gas may cause an increase of fluorine radicals, i.e. cause side etching. In other words, the use of discharge gas containing fluorine atoms will normally form fluorine radicals to some extent in plasma and it is impossible to avoid side etching due to the existence of fluorine radicals. According to the present invention, a suitable amount of hydrogen gas is mixed with a fluorine-containing discharge gas so as to make the fluorine radicals react with the hydrogen atoms to form hydrogen fluoride (HF), thereby reducing the amount of fluorine radicals which mainly causes the side etching. When plasma etching is effected in a discharge gas mixture containing fluorine atoms and hydrogen gas, the etching rate will decrease. A decrease in the etching rate will cause the etching time to increase, resulting in a decrease of producibility of semiconductor elements. Mixing of oxygen gas with the discharge gas mixture containing fluorine and hydrogen atoms can prevent the substantial decrease of the etching rate while causing substantially no side etching.

Figure 2:
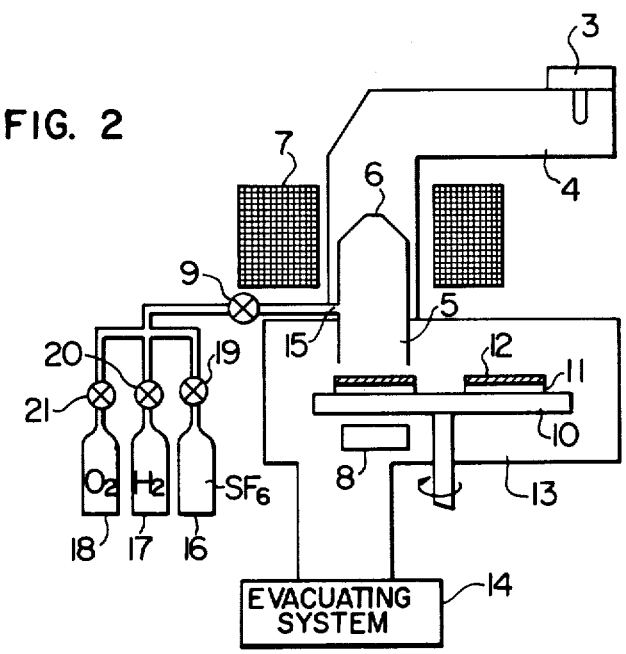
Figure 3:
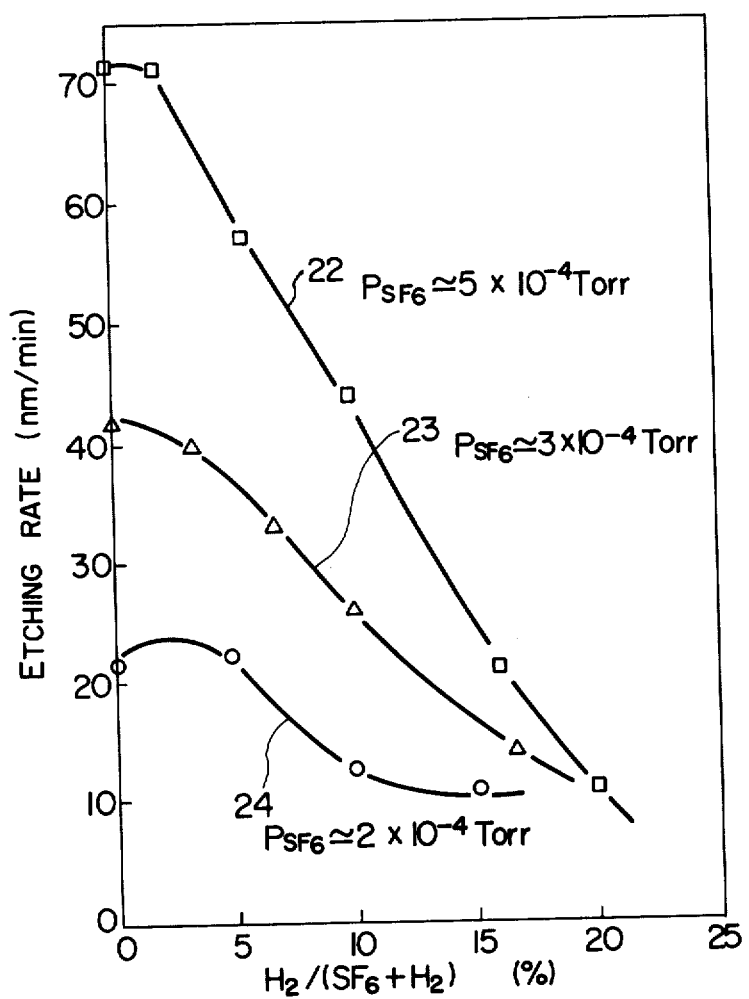
Figure 4:
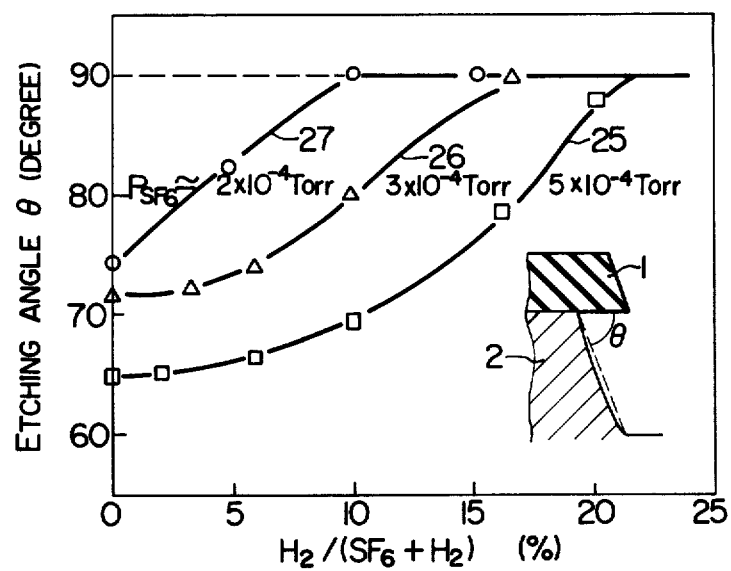
Figure 5:
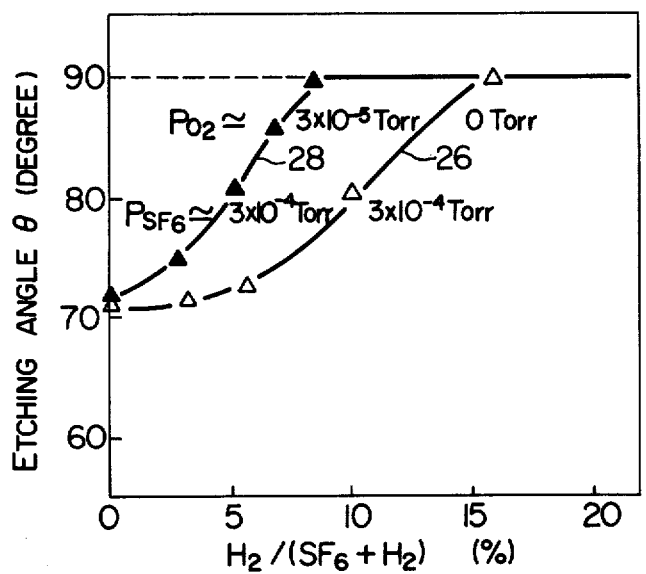

The above and other objects and advantages of the present invention will become apparent from the following description with reference to the accompanying drawings, in which:

FIGS. 1A and 1B show schematic cross-sectional views for illustrating the effect of side etching;

FIG. 2 is a basic arrangement of a microwave plasma etching system in accordance with an embodiment of the present invention; and FIGS. 3 to 5 are graphs showing characteristics of the plasma etching performed in the system shown in FIG. 2, more particularly FIG. 3 shows the etching rate of silicon as a function of the discharge gas composition $H_2/(SF_6+H_2)$, and FIGS. 4 and 5 show the etching angle as a function of the composition $H_2/(SF_6+H_2)$.

Referring now to the drawings, there is shown in FIG. 2 a basic configuration of a microwave plasma etching system. In FIG. 2, a microwave generator 3 comprises a magnetron whose frequency is 2.45 GHz and whose output is typically 600 W. A rectangular waveguide 4 is provided to propagate or guide microwaves generated in the microwave generator 3. A discharge tube 6 is made of insulator such as heatproof glass which transmits microwaves therethrough and maintains vacuum therein. Further, within a process or substrate chamber designated by 13, vacuum is maintained. Term "vacuum chamber" used in the specification hereinafter will refer to a space defined by the discharge tube 6 and the substrate chamber 13. A space designated by 5 forms a major plasma discharge space in the vacuum chamber defined by the discharge tube 6 and the substrate chamber 13. The discharge space 5 is defined by the discharge tube 6 and a substrate 12. The substrate 12 is accomodated on a substrate stage 11 of a turning or rotary table 10. An evacuating system 14 is used to maintain a desired vacuum pressure in the vacuum chamber defined by the discharge tube 6 and the substrate chamber 13. Also, a solenoid 7 is positioned at the periphery of the waveguide 4 to establish a dc magnetic field and a permanent magnet 8 is provided beneath the substrate 12 adjacent to discharge tube 6. The field-making solenoid 7 and the permanent magnet 8 will form a mirror type magnetic field within the discharge space 5 to generate a uniform plasma. The discharge tube 6 is provided at its side wall with a discharge gas inlet 15 through which a discharge gas, for example, $SF_6$ gas is introduced into the discharge space 5 from a $SF_6$ gas bottle via a control valve 19. On the other hand, a gas bottle 17 contains $H_2$ gas and a gas bottle 18 contains $O_2$ gas. $H_2$ gas and $O_2$ gas are mixed with $SF_6$ gas and supplied to the discharge space 5 via control valves 20 and 21. The discharge gas introduced in the discharge space 5 is converted into a plasma under influence of both of the mirror-type magnetic field formed in the discharge space 5 by the solenoid 7 and permanent magnet 8 and the microwave electric field formed in the discharge space 5 by the microwave from the waveguide 4. The reactive ions generated in the plasma moves along the mirror type magnetic field toward the substrate 12 disposed beneath the discharge space 5 to impinge the substrate and etch the surface thereof. Neutral fluorine radicals in the plasma are reacted with hydrogen gas to produce hydrogen fluoride (HF) to thereby eliminate side etching as has been describe above. Thus, the radicals have no appreciable effect on the etching action. Therefore, etching action is performed mainly by ions and the ions are vertically directed onto the surface of the substrate 12 which is kept by a floating potential (approximately −20 V) by ion sheath formed between the plasma and the substrate 12, which results in substantially no side etching.

FIG. 3 is a graph showing relationship of the etching rate (nm/min) as a function of the mixed $H_2$ gas ratio (%) with the pressure of $SF_6$ gas varied as a running parameter, where a mixture of $SF_6$ gas and $H_2$ gas is used as the discharge gas for etching single crystal silicon substrates. In the figure, the $H_2$ mixing ratio (%) of discharge gas is a partial pressure directly read on an ordinary ionization vacuum gauge without calibration. Exactly speaking, it is desirable to calibrate the partial pressure readings since the ionizing yield (sensitivity of the vacuum gauge) slightly changes from gas to gas. Curve 22 shows a case when the partial pressure of $SF_6$ gas is $5 \times 10^{-4}$ Torr, in which the etching rate decreases substantially linearly as the mixed $H_2$ gas ratio increases. Curve 23 shows a case when the partial pressure of $SF_6$ gas is $3 \times 10^{-4}$ Torr, in which the etching rate decreases in a similar form or pattern to the curve 22. Further, curve 24 is for the case when the partial pressure of $SF_6$ is $2 \times 10^{-4}$ Torr, in which the etching rate generally decreases as the mixed $H_2$ gas ratio increases. It will be easily understood from the curves 22 to 24 that (a) the higher the partial pressure of $SF_6$ gas is the higher the etching rate of single crystal silicon substrate is, and (b) the more mixed is the $H_2$ gas the lower the etching rate of single crystal silicon substrate becomes regardless of the partial pressure. We have performed many experiments by varying the value of partial pressure of $SF_6$ gas other than those of FIG. 3. It has been found that the $SF_6$ partial pressure is most preferably within the range between about $8 \times 10^{-4}$ Torr and about $5 \times 10^{-5}$ Torr.

FIG. 4 shows plots of relationship of the etching angle $\theta$ (degree) to the mixed $H_2$ gas ratio (%) with the pressure of $SF_6$ gas varied as a running parameter, where $SF_6$ gas is mixed with $H_2$ gas and the mixed gas is used as the discharge gas in the etching system. As is illustrated, the etching angle is measured by the tangent of the surface and the hypotenuse on the etched side wall. The etching angle is expressed by $\theta$ (degrees). The mask 1 was made of photo-resist. Curve 25 shows a case when the partial pressure of $SF_6$ gas is $5 \times 10^{-4}$ Torr, in which as the mixed $H_2$ gas ratio becomes large, the etching angle $\theta$ approaches to 90 degrees. Curve 26 shows a case when the partial pressure of $SF_6$ gas is $3 \times 10^{-4}$ Torr, in which the etching angle is higher than the curve 25, changes in a similar form or pattern to curve 25 and approaches 90 degrees at a lower mixing ratio. Also, 27 is a curve when the partial pressure of $SF_6$ gas is $2 \times 10^{-4}$ Torr, in which the etching angle is still higher and approaches to 90 degrees at a still lower mixing ratio. As will be appreciated from the curves 25 to 27, as the partial pressure of $SF_6$ gas becomes small, the mixed $H_2$ gas ratio can be small to realize an etching angle of approximately 90 degrees. In this way, mixing $H_2$ gas with $SF_6$ gas will enable realization of 90 degree etching, i.e. etching without causing undesirable side etching. In fine-pattern lithography, it is generally preferable that the etching angle is between 85 degrees and 90 degrees. On the contrary, if it is desired to flatten the etched surface of the substrate, a desired etching angle $\theta$ can be provided by selecting the mixed $H_2$ gas ratio. Our experiments has showed that the $H_2$ partial pressure which has an effect on the etching angle $\theta$ is preferably selected not more than about $8 \times 10^{-4}$ Torr.

FIG. 5 shows how the etching angle $\theta$ (degree) changes when $O_2$ gas is mixed with the mixed discharge gas of $SF_6$ and $H_2$. Curve 26 is a case when the partial pressure of $SF_6$ is $3 \times 10^{-4}$ Torr, as has been explained in FIG. 4. On the other hand, 28 is a curve when the partial pressure of $SF_6$ gas is $3 \times 10^{-4}$ Torr and $O_2$ gas having partial pressure of $3 \times 10^{-5}$ Torr is in addition to $H_2$ gas. It will be clear from the comparison between the curves 26 and 28 that mixture of $O_2$ gas will enable the etching angle $\theta$ to approach to 90 degrees, even if the mixed ratio of $H_2$ gas is low. In other words, in the case where $O_2$ gas is not mixed, provision of 90 degree etching angle will cause the mixed ratio of $H_2$ gas to be approximately 16%. On the other hand, mixing $O_2$ gas will enable the mixed ratio of $H_2$ gas to be about 7%. This means that the etching rate can be made remarkably faster. More specifically, the curve 23 in FIG. 3 is a case when the partial pressure of $SF_6$ gas is $3 \times 10^{-4}$ Torr, in which the etching rate is about 16 nm/min at a mixed $H_2$ gas ratio of 16%. On the other hand, in FIG. 4, the etching rate is about 35 nm/min at a mixed $H_2$ gas of 7%, which results in that the etching rate can be made about two times as large by an addition of $O_2$ gas.

That is, it will be seen from FIGS. 3 and 4 that the etching angle $\theta$ can be reliably set to 90 degrees by increasing the $H_2$ gas to be mixed with the $SF_6$ gas. However, when the mixed $H_2$ gas ratio increases, the etching rate will be reduced substantially. By mixing a suitable amount of $O_2$ gas with the mixed $SF_6$-$O_2$ discharge gas, the reduction of the etching rate due to addition of $H_2$ gas can be minimized while maintaining 90 degrees of the etching angle. In short, the microwave plasma etching according to the present invention will allow high speed etching without side etching. According to our experiments, it is preferable that the partial pressure of $O_2$ gas on which the etching angle $\theta$ depends, does not exceed about $5 \times 10^{-5}$ Torr.

We have also examined how fluorine radicals are reduced when $H_2$ gas is mixed with $SF_6$ gas, by measuring the emission spectrum of $SF_6$ gas plasma. It has been found from our experiments that fluorine atom peaks appearing around a wavelength of 700 nm (685, 690, and 704 nm) can be surely reduced in the intensity by mixing $H_2$ gas with $SF_6$ gas. This means that addition of $H_2$ gas enables reduction of fluorine radicals. In addition, quadropole mass spectrum has proved that mixture of $H_2$ gas causes the increase of hydrogen fluoride (HF) atoms. Therefore, it should be contemplated that fluorine radicals are reduced as a result of reaction of added $H_2$ atoms with fluorine radicals.

It goes without saying that although $SF_6$ gas has been used as the discharge gas in the abovementioned embodiment, the employment of carbon fluoride gas such as $CF_4$ and $C_2F_6$ or any fluoric gas including $SiF_4$, $NF_3$ and the like as the discharge gas can also produce substantially the same effect as the case of $SF_6$ gas, by adding $H_2$ gas or a mixture of $H_2$ and $O_2$ gases.

Further, while a single crystal silicon has been used as a substrate material in the above embodiment, polycrystalline silicon, amorphous silicon, silicon nitride ($Si_3N_4$) and silicide such as molybdenum silicide ($MoSi_2$), multilayer film such as Mo/polysilicon, Mo, Ta, Ti, etc. may of course be employed with substantially the same effect as the case of a single crystal silicon.

Furthermore, although each partial pressure of $H_2$ gas and $O_2$ gas mixed with $SF_6$ gas has been maintained constant without changing in the course of etching process in the above embodiment, the respective partial pressure may be varied in the course of the etching process to control the shape of the etched workpieces. Thereby, etching with a desired resultant cross-section may be performed.

With the microwave plasma etching as has been disclosed, high speed etching can be achieved without substantial side etching, whereby there can be provided semiconductor integrated circuits which are more highly integrated.

While the present invention has been explained with reference to the preferred embodiment shown in the drawings, it should be understood that the invention is not limited thereto, but covers all other possible modifications, alterations and equivalent arrangements in the scope of the appended claims.

What is claimed is:

1. A method of microwave plasma etching comprising the steps of:
   introducing a discharge gas into a vacuum chamber which defines a discharge space, the discharge gas including a mixture of fluorine-containing gas, oxygen gas and hydrogen gas;
   applying a microwave electric field and a magnetic field to said discharge gas in the discharge space, thereby to generate a plasma; and
   injecting activated particles in said plasma to at least one workpiece placed in said vacuum chamber, thereby to etch a surface of said at least one workpiece, whereby the inclusion of both oxygen gas and hydrogen gas in the discharge gas permits etching to be performed with substantially no side etching, while preventing reduction of the etching rate.

2. A method of microwave plasma etching as defined in claim 1, wherein the partial pressure of oxygen gas does not exceed about $5 \times 10^{-5}$ Torr.

3. A method of microwave plasma etching as defined in claim 1, wherein said fluorine-containing gas is selected from the group consisting of $SF_6$, $CF_4$, $C_2F_6$, $SiF_4$, and $NF_3$.

4. A method of microwave plasma etching as defined in claim 1, wherein the partial pressure of hydrogen gas of the discharge gas is not more than $8 \times 10^{-4}$ Torr.

5. A method of microwave plasma etching as defined in claim 2, wherein the partial pressure of hydrogen gas of the discharge gas is not more than $8 \times 10^{-4}$ Torr.

6. A method of microwave plasma etching as defined in claim 1, wherein said fluorine-containing gas is substantially composed of $SF_6$ gas.

7. A method of microwave plasma etching as defined in claim 6, wherein the partial pressure of $SF_6$ gas of the discharge gas is between $8 \times 10^{-4}$ Torr and $5 \times 10^{-5}$ Torr.

8. A method of microwave plasma etching as defined in claim 1, wherein said magnetic field is a dc magnetic field.

9. A method of microwave plasma etching as defined in claim 1, wherein the partial pressures of the fluorine-containing gas and hydrogen gas are varied during the etching of said at least one workpiece to control the shape of the etched surfaces.

10. A method of microwave plasma etching comprising the steps of:
    introducing a discharge gas containing a fluorine-containing gas, oxygen gas and hydrogen gas in a discharge space;
    establishing a magnetic field in the discharge space;
    applying a microwave energy to said discharge gas to generate a plasma including ions and neutral fluorine radicals;
    allowing the neutral fluorine radicals to be reacted with the hydrogen gas; and
    etching at least one workpiece with the plasma mainly by the action of the ions, whereby the inclusion of both oxygen gas and hydrogen gas in the discharge gas enables prevention of side etching, while preventing reduction of the etching rate.

11. A method of microwave plasma etching comprising the steps of:
    introducing a discharge gas containing a fluorine-containing gas, oxygen gas and hydrogen gas in a discharge space;
    establishing a magnetic field in the discharge space;
    applying microwave energy to said discharge gas to generate a plasma including ions and neutral fluorine radicals;

allowing the neutral fluorine radicals to be reacted with the hydrogen gas, causing an improved etching angle, to thereby prevent side etching; and etching at least one workpiece with the plasma mainly by the action of the ions, whereby the inclusion of oxygen gas with the fluorine-containing gas and the hydrogen gas prevents a decreased etching rate, which occurs when using the fluorine-containing gas and the hydrogen gas alone.

12. A method of microwave plasma etching as defined in claim 11, wherein a sufficient amount of oxygen gas and hydrogen gas is utilized to provide said etching angle to be between 85-90 degrees.

* * * * *